(12) United States Patent
Lee et al.

(10) Patent No.: US 11,502,111 B2
(45) Date of Patent: Nov. 15, 2022

(54) DISPLAY APPARATUS

(71) Applicant: Samsung Display Co., Ltd., Yongin-si (KR)

(72) Inventors: Sunwoo Lee, Yongin-si (KR); Kihyun Kim, Yongin-si (KR); Younggil Park, Yongin-si (KR); Seulgi Lee, Yongin-si (KR); Geunhyuk Choi, Yongin-si (KR); Jaebum Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/320,963

(22) Filed: May 14, 2021

(65) Prior Publication Data

US 2021/0384229 A1    Dec. 9, 2021

(30) Foreign Application Priority Data

Jun. 5, 2020 (KR) .......................... 10-2020-0068599

(51) Int. Cl.
*H01L 27/14* (2006.01)
*H01L 27/12* (2006.01)
*H01L 29/786* (2006.01)

(52) U.S. Cl.
CPC ........ *H01L 27/1229* (2013.01); *H01L 27/124* (2013.01); *H01L 27/1255* (2013.01); *H01L 29/78693* (2013.01); *H01L 29/78696* (2013.01)

(58) Field of Classification Search
CPC ............... H01L 27/1229; H01L 27/124; H01L 27/1255; H01L 29/78693; H01L 29/78696

(Continued)

(56) References Cited

U.S. PATENT DOCUMENTS

| 7,652,287 B2 | 1/2010 | Jeong et al. |
| 9,859,391 B2 | 1/2018 | Tanaka |

(Continued)

FOREIGN PATENT DOCUMENTS

| JP | 2017-85079 | 5/2017 |
| KR | 10-0631399 | 10/2006 |

(Continued)

OTHER PUBLICATIONS

International Search Report corresponding to International Application No. PCT/KR2021/006818 dated Sep. 6, 2021.

*Primary Examiner* — Tan N Tran
(74) *Attorney, Agent, or Firm* — Kile Park Reed & Houtteman PLLC

(57) ABSTRACT

A display apparatus includes a first silicon transistor including a first semiconductor layer including a silicon-based semiconductor and a first gate electrode; a first oxide transistor including a second semiconductor layer and a second gate electrode, the second semiconductor layer including an oxide-based semiconductor; an upper insulating layer on the first and second semiconductor layers; and a first connection electrode on the upper insulating layer, electrically connected to the first semiconductor layer through a first contact hole of the upper insulating layer, and electrically connected to the second semiconductor layer through a second contact hole of the upper insulating layer. The second semiconductor layer includes a channel region, a source region, and a drain region, and a first distance between the channel region of the second semiconductor layer and the first contact hole is about 2 μm or greater.

25 Claims, 13 Drawing Sheets

(58) Field of Classification Search
USPC .............................................. 257/43, 59, 72
See application file for complete search history.

(56) References Cited

U.S. PATENT DOCUMENTS

| | | |
|---|---|---|
| 10,297,622 B2 | 5/2019 | Na et al. |
| 10,490,617 B2 | 11/2019 | Kim et al. |
| 11,107,844 B2 * | 8/2021 | Je ...................... H01L 21/02667 |
| 2019/0250443 A1 | 8/2019 | Watakabe et al. |
| 2019/0305065 A1 | 10/2019 | Kim et al. |
| 2019/0312061 A1 | 10/2019 | Son et al. |
| 2020/0105799 A1 | 4/2020 | Yuan |

FOREIGN PATENT DOCUMENTS

| | | |
|---|---|---|
| KR | 10-0907400 | 7/2009 |
| KR | 10-0917820 | 9/2009 |
| KR | 10-2018-0024817 | 3/2018 |
| KR | 10-2018-0025354 | 3/2018 |
| KR | 10-2018-0061720 | 6/2018 |
| KR | 10-2019-0115135 | 10/2019 |
| KR | 10-2019-0116608 | 10/2019 |

\* cited by examiner

DISPLAY APPARATUS

CROSS-REFERENCE TO RELATED APPLICATION(S)

This application claims priority to and benefits of Korean Patent Application No. 10-2020-0068599 under 35 U.S.C. § 119, filed on Jun. 5, 2020, in the Korean Intellectual Property Office, the entire contents of which are incorporated herein by reference.

BACKGROUND

1. Technical Field

One or more embodiments relate to a display apparatus.

2. Description of the Related Art

A light-emitting diode display apparatus, unlike a liquid crystal display apparatus, is a display apparatus that displays images and is self-emitting. Accordingly, since a separate light source is not required, a thickness and weight of the light-emitting diode display apparatus may be reduced. For example, an organic light-emitting diode display apparatus may have high-quality characteristics such as low power consumption, high brightness, and high response speeds.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus that displays a high-quality image.

Additional aspects will be set forth in part in the description which follows and, in part, will be apparent from the description, or may be learned by practice of the presented embodiments of the disclosure.

According to one or more embodiments, a display apparatus may include a first silicon transistor including a first semiconductor layer including a silicon-based semiconductor; and a first gate electrode overlapping the first semiconductor layer; a first oxide transistor including a second semiconductor layer spaced apart from the first semiconductor layer and including an oxide-based semiconductor; and a second gate electrode; an upper insulating layer disposed on the first semiconductor layer and the second semiconductor layer, the upper insulating layer including a first contact hole and a second contact hole; and a first connection electrode disposed on the upper insulating layer, electrically connected to the first semiconductor layer through the first contact hole, and electrically connected to the second semiconductor layer through the second contact hole, wherein the second semiconductor layer may include a channel region, a source region, and a drain region, the source region and the drain region being arranged at opposite sides of the channel region, and a first distance between the channel region of the second semiconductor layer and the first contact hole may be about 2 µm or greater.

A hydrogen concentration of the source region or the drain region of the second semiconductor layer may be about $1.1 \times 10^{21}$ atom/cm$^3$ or greater.

The display apparatus may further include an insulating layer disposed between the first semiconductor layer and the second semiconductor layer.

The first semiconductor layer may include a channel region, a source region, and a drain region, the source region and the drain region being arranged at opposite sides of the channel region, and the channel region of the first semiconductor layer may include a bent shape.

The display apparatus may further include a node connection line electrically connecting the first gate electrode of the first silicon transistor to the first oxide transistor.

The display apparatus may further include a second oxide transistor including a third semiconductor layer and a third gate electrode, the third semiconductor layer including an oxide-based semiconductor.

The third semiconductor layer of the second oxide transistor and the second semiconductor layer of the first oxide transistor may be integral with each other.

The display apparatus may further include an initialization voltage line; a first signal line extending in a same direction as the initialization voltage line; and a second connection electrode disposed on the third semiconductor layer of the second oxide transistor and the initialization voltage line, the second connection electrode electrically connecting the initialization voltage line to the third semiconductor layer.

The upper insulating layer may further include a third contact hole, the second connection electrode may be electrically connected to the initialization voltage line through the third contact hole, and a second distance between the channel region of the third semiconductor layer and the third contact hole may be about 2 µm or greater.

The first signal line may include a first conductive layer overlapping the third semiconductor layer; and a second conductive layer disposed below the second semiconductor layer; and an insulating layer disposed between the first conductive layer and the second conductive layer and including a contact hole, wherein the first conductive layer may be electrically connected to the second conductive layer through the contact hole of the insulating layer.

A width of the contact hole of the insulating layer may be about 2.2 µm or less.

A third distance between a channel region of the third semiconductor layer and the contact hole of the insulating layer may be about 2.4 µm or greater.

The insulating layer may include lateral surfaces that form the contact hole, and an inclination angle of the lateral surfaces may be about 86° or less.

The display apparatus may further include a first capacitor electrically connected to the first silicon transistor, and a second capacitor electrically connected to the first oxide transistor.

An electrode of the second capacitor and the second semiconductor layer may include a same material.

According to one or more embodiments, a display apparatus may include a silicon-based semiconductor layer including a first semiconductor layer of a first silicon transistor; an oxide-based semiconductor layer spaced apart from the silicon-based semiconductor layer, the oxide-based semiconductor layer including a second semiconductor layer of a first oxide transistor; an upper insulating layer disposed on the silicon-based semiconductor layer and the oxide-based semiconductor layer, the upper insulating layer including a first contact hole and a second contact hole; and a first connection electrode disposed on the upper insulating layer, electrically connected to the first semiconductor layer through the first contact hole, and electrically connected to the second semiconductor layer through the second contact hole, wherein the oxide-based semiconductor layer may include a channel region of the first oxide transistor, and a first distance between the channel region and the first contact hole may be about 2 μm or greater.

The oxide-based semiconductor layer may further include a third semiconductor layer of a second oxide transistor, and the second semiconductor layer and the third semiconductor layer may be integral with each other.

Each of the second semiconductor layer and the third semiconductor layer may include a channel region, and a source region and a drain region respectively arranged at opposite sides of the channel region, wherein a hydrogen concentration of the source region or the drain region may be about $1.1 \times 10^{21}$ atom/cm$^3$ or greater.

The display apparatus may further include an initialization voltage line that may provide an initialization voltage to the second oxide transistor; and a second connection electrode disposed on the third semiconductor layer of the second oxide transistor and the initialization voltage line and electrically connecting the initialization voltage line to the third semiconductor layer.

The upper insulating layer may further include a third contact hole, the second connection electrode may be electrically connected to the initialization voltage line through the third contact hole, and a second distance between the channel region of the third semiconductor layer and the third contact hole may be about 2 μm or greater.

The display apparatus may further include a first signal line overlapping the second semiconductor layer of the first oxide transistor; and a second signal line overlapping the third semiconductor layer of the second oxide transistor, wherein the first signal line or the second signal line may include a first conductive layer overlapping the oxide-based semiconductor layer, and a second conductive layer disposed below the oxide-based semiconductor layer; and an insulating layer disposed between the first conductive layer and the second conductive layer and including a contact hole, wherein the first conductive layer may be electrically connected to the second conductive layer through the contact hole.

A width of the contact hole may be about 2.2 μm or less.

A third distance between the channel region of the third semiconductor layer and the contact hole of the insulating layer may be about 2.4 μm or greater.

The insulating layer may include lateral surfaces that form the contact hole, and an inclination angle of the lateral surfaces may be about 86° or less.

The display apparatus may further include an insulating layer disposed between the silicon-based semiconductor layer and the oxide-based semiconductor layer.

These and/or other aspects will become apparent and more readily appreciated from the following description of the embodiments, the accompanying drawings, and claims.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
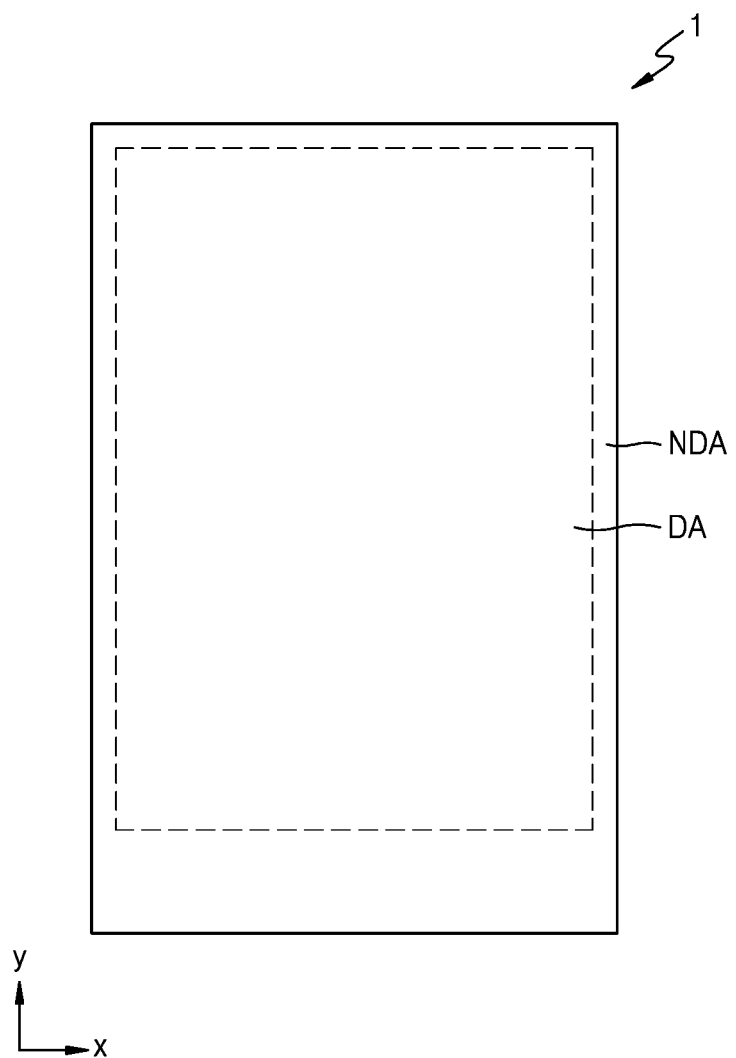
FIG. 1 is a plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

As the disclosure allows for various changes and numerous embodiments, embodiments will be illustrated in the drawings and described in detail in the written description. Effects and characteristics of the disclosure, and a method of accomplishing the same will become apparent and more readily appreciated from the following description of the embodiments and the accompanying drawings. However, the disclosure is not limited to embodiments below and may be implemented in various forms.

Hereinafter, embodiments are described in detail with reference to the accompany drawings. When description is made with reference to the drawings, like reference numerals are given to like or corresponding elements, and repeated descriptions thereof may be omitted.

It will be understood that although the terms "first," "second," etc. may be used herein to describe various components, these components should not be limited by these terms. These components are only used to distinguish one component from another. For example, a first element could be termed a second element, and, similarly, a second element could be termed a first element, without departing from the scope of example embodiments.

As used herein, the singular forms "a," "an," and "the" are intended to include the plural forms as well, unless the context clearly indicates otherwise.

It will be further understood that the terms "comprises" and/or "comprising", "includes" and/or "including", "have" and/or "having" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated or reduced for convenience of explanation. In other words, since sizes and thicknesses of components in the drawings are arbitrarily illustrated for convenience of explanation, the following embodiments are not limited thereto.

In addition, terms such as "below," "lower," "above," "upper," and the like are used to describe the relationship of the configurations shown in the drawings. The terms are used as a relative concept and may be described with reference to the direction indicated in the drawings.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component and/or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view of a display apparatus 1 according to an embodiment.

As shown in FIG. 1, the display apparatus 1 may include a display area DA and a non-display area NDA around (or adjacent to) the display area DA.

The display area DA may display an image. The display area DA may include pixels. Each pixel may include a light-emitting element, for example, a light-emitting diode. Each light-emitting diode may be electrically connected to a circuit element including a transistor and a capacitor. The circuit element may be arranged or disposed in the display area DA.

The non-display area NDA may be an area on which an image may not be displayed. The non-display area NDA may entirely surround or may be adjacent to the display area DA. A driver, for example, may be arranged or disposed in the non-display area NDA, the driver may provide an electric signal or power to a circuit element and/or a light-emitting diode arranged or disposed in the display area DA. The non-display area NDA may include a pad that may be a region or an area to which an electronic element or a printed circuit board, for example, may be electrically connected.

Though it is shown in FIG. 1 that the display apparatus 1 and the display area DA are approximately quadrangular, this is provided as an example. According to another example, the display apparatus 1 and/or the display area DA may be substantially circular, substantially elliptical, or may have various substantially polygonal shapes.

Figure 2:
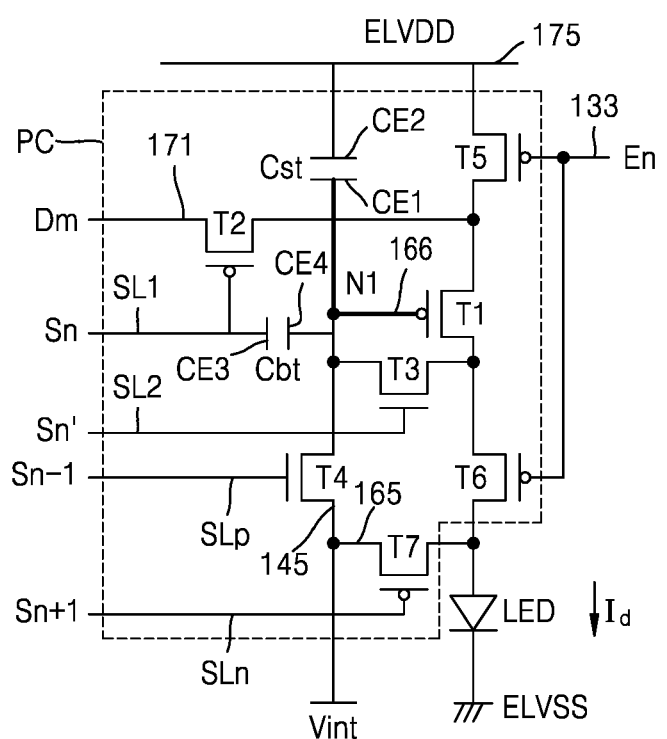
FIG. 2 is an equivalent circuit diagram of a light-emitting diode and a pixel circuit electrically connected to the light-emitting diode of a display apparatus according to an embodiment.

FIG. 2 is an equivalent circuit diagram of a light-emitting diode and a pixel circuit PC electrically connected to the light-emitting diode of a display apparatus according to an embodiment.

Referring to FIG. 2, the pixel circuit PC electrically connected to a light-emitting diode LED may include transistors and capacitors. The pixel circuit PC may include first to seventh transistors T1, T2, T3, T4, T5, T6, and T7, a storage capacitor Cst, and a boost capacitor Cbt.

Some or a predetermined number of the first to seventh transistors T1, T2, T3, T4, T5, T6, and T7 may include n-channel metal oxide semiconductor field effect transistors (MOSFET), and the rest may include p-channel metal oxide semiconductor field effect transistors (MOSFET). As an example, the third and fourth transistors T3 and T4 may include n-channel MOSFET (NMOS), and the rest may include p-channel MOSFET (PMOS). In an embodiment, the first, fourth, and seventh transistors T3, T4, and T7 may include NMOS, and the rest may include PMOS. Alternatively, only one of the first to seventh transistors T1, T2, T3, T4, T5, T6, and T7 may include an NMOS, and the rest may include PMOS.

The first to seventh transistors T1, T2, T3, T4, T5, T6, and T7, the storage capacitor Cst, and the boost capacitor Cbt may be electrically connected to signal lines.

The signal lines may include a first scan line SL1, a second scan line SL2, a previous scan line SLp, an emission control line 133, a next scan line SLn, and a data line 171, the first scan line SL1 may transfer a first scan signal Sn, the second scan line SL2 may transfer a second scan signal Sn', the previous scan line SLp may transfer a previous scan signal Sn-1, the emission control line 133 may transfer an emission control signal En, the next scan line SLn may transfer the nest scan signal Sn+1, and the data line 171 crossing or intersecting the first scan line SL1 and may transfer a data signal Dm.

A driving voltage line 175 may transfer a driving voltage (or first power voltage) ELVDD to the first transistor T1, and first and second initialization voltage lines 145 and 165 may transfer an initialization voltage Vint.

The first transistor T1 may include a driving transistor. A first gate electrode (or a first control electrode) of the first transistor T1 may be electrically connected to the storage capacitor Cst, a first electrode of the driving transistor T1 may be electrically connected to the driving voltage line 175 through the fifth transistor T5, and a second electrode of the first transistor T1 may be electrically connected to a pixel electrode (or first electrode) of the light-emitting diode LED through the sixth transistor T6. One of the first electrode and the second electrode of the first transistor T1 may include a source electrode, and the other may include a drain electrode. The first transistor T1 may receive a data signal Dm according to a switching operation of the second transistor T2 and supply a driving current $I_d$ to the light-emitting diode LED. The light-emitting diode LED may emit light having predetermined brightness by using the driving current $I_d$. An opposite electrode (or second electrode, e.g. a cathode) of the light-emitting diode LED may receive a common voltage (or second power voltage) ELVSS.

The second transistor T2 may include a switching transistor. A second gate electrode (or a second control electrode) of the second transistor T2 may be electrically connected to the first scan line SL1, a first electrode of the second transistor T2 may be electrically connected to the data line 171, and a second electrode of the second transistor T2 may be electrically connected to the first electrode of the first transistor T1 and simultaneously and electrically connected to the driving voltage line 175 through the fifth transistor T5. One of the first electrode and the second electrode of the second transistor T2 may include a source electrode, and the other may include a drain electrode. The second transistor T2 may be turned on according to a first scan signal Sn transferred through the first scan line SL1 and may perform a switching operation of transferring a data signal Dm transferred through the data line 171 to the first electrode of the first transistor T1.

The third transistor T3 may include a compensation transistor that may compensate for a threshold voltage of the first transistor T1. A third gate electrode (or a compensation control electrode) of the third transistor T3 may be electrically connected to the second scan line SL2. A first electrode of the third transistor T3 may be electrically connected to a first electrode CE1 of the storage capacitor Cst and the first gate electrode of the first transistor T1 through a node connection line 166. The first electrode of the third transistor T3 may be electrically connected to the fourth transistor T4. A second electrode of the third transistor T3 may be electrically connected to the second electrode of the first transistor T1 and simultaneously and electrically connected to the pixel electrode of the light-emitting diode LED through the sixth transistor T6. One of the first electrode and the second electrode of the third transistor T3 may include a source electrode, and the other may include a drain electrode.

The third transistor T3 is turned on according to a second scan signal Sn' transferred through the second scan line SL2 and diode-connects the first transistor T1 by electrically connecting the first gate electrode to the second electrode of the first transistor T1.

The fourth transistor T4 may include a first initialization transistor that may initialize the first gate electrode of the first transistor T1. A fourth gate electrode (or a fourth control electrode) of the fourth transistor T4 may be electrically connected to the previous scan line SLp. A first electrode of the fourth transistor T4 may be electrically connected to the first initialization voltage line 145. A second electrode of the fourth transistor T4 may be electrically connected to the first electrode CE1 of the storage capacitor Cst, the first electrode of the third transistor T3, and the first gate electrode of the first transistor T1. One of the first electrode and the second electrode of the fourth transistor T4 may include a source electrode, and the other may include a drain electrode. The fourth transistor T4 may be turned on according to a previous scan signal Sn-1 and may perform an initialization operation of initializing the voltage of the first gate electrode of the first transistor T1 by transferring the initialization voltage Vint to the first gate electrode of the first transistor T1.

The fifth transistor T5 may include an operation control transistor. A fifth gate electrode (or a fifth control electrode) of the fifth transistor T5 may be electrically connected to the emission control line 133, a first electrode of the fifth transistor T5 may be electrically connected to the driving voltage line 175, and a second electrode of the fifth transistor T5 may be electrically connected to the first electrode of the first transistor T1 and the second electrode of the second transistor T2. One of the first electrode and the second electrode of the fifth transistor T5 may include a source electrode, and the other may include a drain electrode.

The sixth transistor T6 may include an emission control transistor. A sixth gate electrode (or a sixth control electrode) of the sixth transistor T6 may be electrically connected to the emission control line 133, a first electrode of the sixth transistor T6 is connected to the second electrode of the first transistor T1 and the second electrode of the third transistor T3, and a second electrode of the sixth transistor T6 may be electrically connected to a second electrode of the seventh transistor T7 and the pixel electrode of the light-emitting diode LED. One of the first electrode and the second electrode of the sixth transistor T6 may include a source electrode, and the other may include a drain electrode.

The fifth transistor T5 and the sixth transistor T6 may be simultaneously turned on according to an emission control signal En transferred through the emission control line 133 and may allow the driving voltage ELVDD to be transferred to the light-emitting diode LED and thus allow the driving current $I_d$ to flow through the light-emitting diode LED.

The seventh transistor T7 may include a second initialization transistor that may initialize the pixel electrode of the light-emitting diode LED. A seventh gate electrode (or a seventh control electrode) of the seventh transistor T7 may be electrically connected to the next scan line SLn. A first electrode of the seventh transistor T7 may be electrically connected to the second initialization voltage line 165. A second electrode of the seventh transistor T7 may be electrically connected to the second electrode of the sixth transistor T6 and the pixel electrode of the light-emitting diode LED. The seventh transistor T7 may be turned on according to a next scan signal Sn+1 transferred through the next scan line SLn to initialize the pixel electrode of the light-emitting diode LED. Though it is shown in FIG. 2 that the seventh transistor T7 may be electrically connected to the next scan line SLn, the seventh transistor T7 may be electrically connected to the emission control line 133 and driven according to an emission control signal En.

The storage capacitor Cst may include the first electrode CE1 and a second electrode CE2. The first electrode CE1 of the storage capacitor Cst may be electrically connected to the first gate electrode of the first transistor T1, and the second electrode CE2 of the storage capacitor Cst may be electrically connected to the driving voltage line 175. The storage capacitor Cst may store charges corresponding to a difference between the voltage of the first gate electrode of the first transistor T1 and the driving voltage ELVDD.

The boost capacitor Cbt may include a third electrode CE3 and a fourth electrode CE4. The third electrode CE3 may be electrically connected to the second gate electrode of the second transistor T2 and the first scan line SL1, and the fourth electrode CE4 may be electrically connected to the first electrode of the third transistor T3 and the node connection line 166. The boost capacitor Cbt may raise the voltage of the first node N1 in a case that a first scan signal Sn supplied to the first scan line SL1 is turned off. In a case that the voltage of the first node N1 is raised, a black grayscale may be clearly expressed.

The first node N1 may include a portion or region electrically connected to the first gate electrode of the first transistor T1, the first electrode of the third transistor T3, the second electrode of the fourth transistor T4, and the fourth electrode CE4 of the boost capacitor Cbt.

As an embodiment, FIG. 2 describes that the third and fourth transistors T3 and T4 are NMOS, and the first, second, fifth to seventh transistors T1, T2, T5, T6, and T7 are PMOS. The first transistor T1 directly influencing the brightness of a display apparatus may include a semiconductor layer including polycrystalline silicon having a high reliability. Through this, a high-resolution display apparatus may be implemented.

For example, since an oxide-based semiconductor may have a high carrier mobility and a low leakage current, a voltage drop may not be large even though a driving time may be long. For example, even during a low-frequency driving, a color change of an image depending on a voltage drop may not be large and thus a transistor including the oxide-based semiconductor may be driven at low frequencies. Since an oxide-based semiconductor may have an advantage that a leakage current may be small, the third transistor T3 and/or the fourth transistor T4 each electrically connected to a first gate electrode G1 of the first transistor T1 may include an oxide-based semiconductor to prevent a leakage current that may flow to the first gate electrode G1 and simultaneously reduce power consumption. In an embodiment, each of the third transistor T3, the fourth transistor T4, and/or the seventh transistor T7 may include an oxide transistor including an oxide-based semiconductor.

Figure 3:
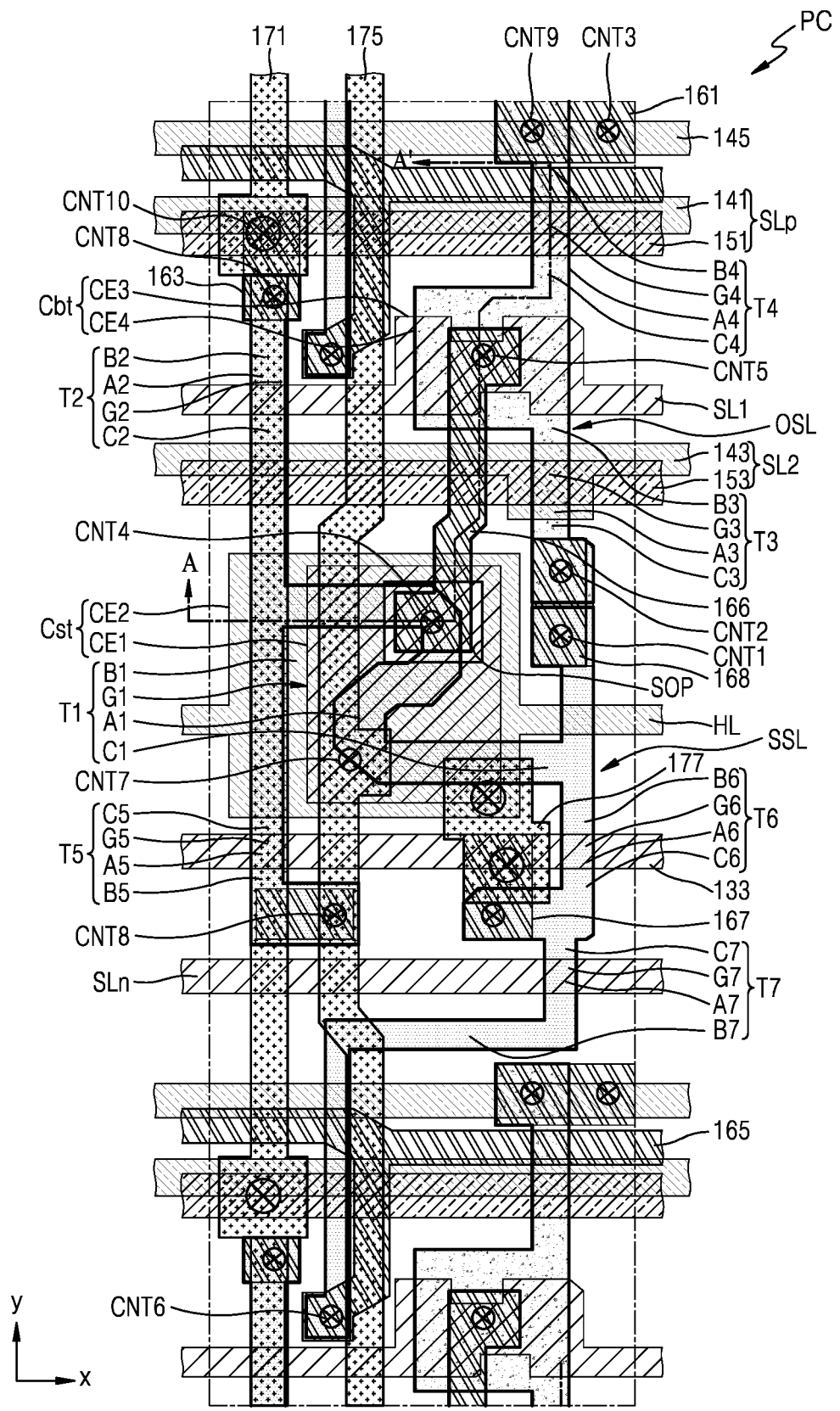
FIG. 3 is a plan view of a pixel circuit arranged on an N-th row of a display apparatus according to an embodiment.

FIG. 3 is a plan view of a pixel circuit arranged or disposed on an N-th row of a display apparatus according to an embodiment.

Referring to FIG. 3, the pixel circuit PC may include the first scan line SL1, the second scan line SL2, the previous scan line SLp, the next scan line SLn, the emission control line 133, the first initialization voltage line 145, and the second initialization voltage line 165 each extending in a first direction (for example an x-direction), and include the data line 171 and the driving voltage line 175 each extending in a second direction (for example a y-direction) intersecting the first direction.

As described above with reference to FIG. 2, the pixel circuit PC may include the first to seventh transistors T1, T2, T3, T4, T5, T6, and T7, the storage capacitor Cst, and the boost capacitor Cbt.

In an embodiment, each of the first transistor T1, the second transistor T2, the fifth transistor T5, the sixth transistor T6, and the seventh transistor T7 may include a silicon transistor including a silicon-based semiconductor. For example, each of the third transistor T3 and the fourth transistor T4 may include an oxide transistor including an oxide-based semiconductor.

Semiconductor layers A1, A2, A5, A6, and A7 of the first transistor T1, the second transistor T2, the fifth transistor T5, the sixth transistor T6, and the seventh transistor T7 may be arranged or disposed on the same layer, may include the same or similar material, and may be electrically connected to each other to be integral with each other. The semiconductor layers A1, A2, A5, A6, and A7 of the first transistor T1, the second transistor T2, the fifth transistor T5, the sixth transistor T6, and the seventh transistor T7 may include, for example, polycrystalline silicon.

Each of the semiconductor layers A1, A2, A5, A6, and A7 of the first transistor T1, the second transistor T2, the fifth transistor T5, the sixth transistor T6, and the seventh transistor T7 may include a channel region, a first region, and a second region, the first region and the second region being respectively at opposite sides of the channel region. The first region and the second region may include an impurity region and include N-type impurities or P-type impurities. One of the first region and the second region may include a source region and the other may include a drain region. As described above with reference to FIG. 2, the first region may correspond to a first electrode (a source region or a drain region) of a relevant transistor, and the second region may correspond to a second electrode (a drain region or a source region) of the relevant transistor.

The semiconductor layers A3 and A4 of the third transistor T3 and the fourth transistor T4 may be arranged or disposed on the same layer, may include the same or similar material, and may be electrically connected to each other to be integral with each other. The semiconductor layers A3 and A4 of the third transistor T3 and the fourth transistor T4 may include a Zn-oxide-based material, for example, Zn-oxide, In—Zn oxide, and Ga—In—Zn oxide. In an embodiment, the semiconductor layers A3 and A4 of the third transistor T3 and the fourth transistor T4 may include an In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

Each of the semiconductor layers A3 and A4 of the third transistor T3 and the fourth transistor T4 may include a channel region, a first region and a second region, the first region and the second region being respectively at opposite sides of the channel region. Each of the first region and the second region may include a conductive region and may be formed by adjusting carrier concentration of an oxide semiconductor and making the source region and the drain region conductive. For example, the conductive region may be formed by increasing carrier concentration through plasma treatment that may use a hydrogen (H)-based gas, a fluorine (F)-based gas, or a combination of these, the plasma treatment being performed on the oxide-based semiconductor of the third transistor T3 and the fourth transistor T4.

The first region of each of the semiconductor layers A3 and A4 of the third transistor T3 and the fourth transistor T4 may correspond to the first electrode (the source electrode or the drain electrode) described above with reference to FIG. 2, and the second region may correspond to the second electrode (the drain electrode or the source electrode).

A silicon-based semiconductor layer SSL including the semiconductor layers A1, A2, A5, A6, and A7 of the first transistor T1, the second transistor T2, the fifth transistor T5, the sixth transistor T6, and the seventh transistor T7 may be apart from an oxide-based semiconductor layer OSL including the semiconductor layers A3 and A4 of the third transistor T3 and the fourth transistor T4 as shown in FIG. 3.

The silicon-based semiconductor layer SSL may be bent in various shapes, and the first transistor T1, the second transistor T2, the fifth transistor T5, the sixth transistor T6, and the seventh transistor T7 may be arranged or disposed along the bent shape of the silicon-based semiconductor layer SSL.

The semiconductor layer A1 of the first transistor T1 may include a portion of the silicon-based semiconductor layer SSL and may include a channel region, a first region B1, and a second region C1, the channel region overlapping the first gate electrode G1 of the first transistor T1, and the first region B1 and the second region C1 being respectively at opposite sides of the channel region. The channel region of the first transistor T1 may have a substantially bent shape. As an example, though it is shown in FIG. 3 that the channel region of the first transistor T1 may have a substantially alphabet S-shape, the channel region of the first transistor T1 may have a shape that may be bent multiple times like an omega or substantially alphabet C-shape in an embodiment. As the channel region of the first transistor T1 may have a substantially bent shape, a long channel length may be formed on a narrow plane, and a driving range of a gate voltage applied to the first gate electrode G1 widens and accordingly, a grayscale of light emitted from the light-emitting diode LED may be more elaborately controlled and a display quality may be improved. The first gate electrode G1 of the first transistor T1 may be formed to have an isolated or island configuration.

The semiconductor layer A2 of the second transistor T2 may include a portion of the silicon-based semiconductor layer SSL and may include a channel region, a first region B2, and a second region C2, the channel region overlapping a second gate electrode G2 of the second transistor T2, and the first region B2 and the second region C2 being respectively at opposite sides of the channel region. The second gate electrode G2 of the second transistor T2 may include a portion of the first scan line SL1 extending in the first direction. The first region B2 of the second transistor T2 may be electrically connected to the data line 171 through a contact hole of an insulating layer between the semiconductor layer A2 of the second transistor T2 and the data line 171. As an example, since a mediation metal 163 between the semiconductor layer A2 of the second transistor T2 and the data line 171 may be electrically connected to the semiconductor layer A2 through an eighth contact hole CNT8, and the data line 171 may be electrically connected to the mediation metal 163 through a tenth contact hole CNT10, the semiconductor layer A2 of the second transistor T2 may be electrically connected to the data line 171. In an embodiment, the semiconductor layer A2 of the second transistor T2 may be directly electrically connected to the data line 171 through a contact hole therebetween without a mediation metal. The second region C2 of the second transistor T2 may be electrically connected to the first region B1 of the first transistor T1.

The semiconductor layer A3 of the third transistor T3 may include a portion of the oxide-based semiconductor layer OSL and may include a channel region, a first region B3, and a second region C3, the channel region overlapping a third gate electrode G3, and the first region B3 and the second region C3 being respectively at opposite sides of the channel region.

The channel region of the third transistor T3 may overlap the second scan line SL2. The third gate electrode G3 of the third transistor T3 may include a portion of the second scan line SL2 extending in the first direction. The second scan line SL2 may include a first conductive layer 143 and a second conductive layer 153 respectively arranged or disposed on different layer and electrically connected to each other. The first conductive layer 143 may be arranged or disposed below the semiconductor layer A3 of the third transistor T3. The second conductive layer 153 may be arranged or disposed over the semiconductor layer A3 of the third transistor T3. A portion of the first conductive layer 143 and a portion of the second conductive layer 153 that overlap the semiconductor layer A3 of the third transistor T3 may respectively correspond to a bottom gate electrode and a top gate electrode. For example, the third gate electrode G3 of the third transistor T3 may have a double gate structure.

The first region B3 of the semiconductor layer A3 of the third transistor T3 may be electrically connected to the semiconductor layer A4 of the fourth transistor T4, and electrically connected to the first gate electrode G1 of the first transistor T1 through the node connection line 166. As an example, the node connection line 166 may be electrically connected to the first gate electrode G1 through a fourth contact hole CNT4, and electrically connected to the first region B3 of the semiconductor layer A3 of the third transistor T3 through a fifth contact hole CNT5. The fourth contact hole CNT4 may pass through an insulating layer(s) between the first gate electrode G1 and the node connection line 166, and the fifth contact hole CNT5 may pass through an insulating layer(s) between the oxide-based semiconductor layer OSL and the node connection line 166. The second electrode CE2 of the storage capacitor Cst described below may include an opening SOP corresponding to the fourth contact hole CNT4.

The second region C3 of the semiconductor layer A3 of the third transistor T3 may be electrically connected to the first connection electrode 168. As an example, the first connection electrode 168 may be electrically connected to a portion of the silicon-based semiconductor layer SSL, for example, the second region D2 of the semiconductor layer A1 of the first transistor T1 through the first contact hole CNT1 and be electrically connected to a portion of the oxide-based semiconductor layer OSL, for example, the second region C3 of the semiconductor layer A3 of the third transistor T3 through the second contact hole CNT2. The first contact hole CNT1 may pass through an insulating layer(s) between the silicon-based semiconductor layer SSL and the first connection electrode 168. The second contact hole CNT2 may pass through an insulating layer(s) between the oxide-based semiconductor layer OSL and the first connection electrode 168.

The first region B3 and the second region C3 of the semiconductor layer A3 of the third transistor T3 may be made conductive by using a gas including hydrogen. Therefore, the first region B3 and the second region C3 may include hydrogen.

The semiconductor layer A4 of the fourth transistor T4 may include a portion of the oxide-based semiconductor layer OSL and include a channel region, a first region B4, and a second region C4, the channel region overlapping a fourth gate electrode G4, and the first region B4 and the second region C4 being respectively at opposite sides of the channel region.

The channel region of the fourth transistor T4 may overlap the previous scan line SLp, and the fourth gate electrode G4 may include a portion of the previous scan line SLp. The previous scan line SLp may include conductive layers respectively arranged or disposed on different layers and electrically connected to each other. As an example, the previous scan line SLp may include a third conductive layer 141 and a fourth conductive layer 151. The third conductive layer 141 may be arranged or disposed below the semiconductor layer A4 of the fourth transistor T4. The fourth conductive layer 151 may be arranged or disposed over the semiconductor layer A4 of the fourth transistor T4. A portion of the third conductive layer 141 and a portion of the fourth conductive layer 151 that overlap the semiconductor layer A4 of the fourth transistor T4 may respectively correspond to a bottom gate electrode and a top gate electrode.

The first region B4 of the semiconductor layer A4 of the fourth transistor T4 may be electrically connected to the first initialization voltage line 145 through a second connection line 161. The second region C4 may be electrically connected to the third semiconductor layer A3 of the third transistor T3. The second connection line 161 may be electrically connected to the first initialization voltage line 145 through the third contact hole CNT3 and electrically connected to the first region B4 of the fourth transistor T4 through a ninth contact hole CNT9. The third contact hole CNT3 may be formed in an insulating layer(s) between the first initialization voltage line 145 and the second connection electrode 161. The ninth contact hole CNT9 may be formed in an insulating layer(s) between the oxide-based semiconductor layer OSL and the second connection electrode 161.

The first region B4 and the second region C4 of the semiconductor layer A4 of the fourth transistor T4 may be made conductive by using a gas including hydrogen. Therefore, the first region B4 and the second region C4 may include hydrogen. Alternatively, the first region B4 and the second region C4 of the fourth transistor T4 may include fluorine or both hydrogen and fluorine.

The semiconductor layer A5 of the fifth transistor T5 may include a portion of the silicon-based semiconductor layer SSL and include a channel region, a first region B5, and a second region C5, the channel region overlapping a fifth gate electrode G5 of the fifth transistor T5, and the first region B5 and the second region C5 being respectively at opposite sides of the channel region.

The fifth gate electrode G5 of the fifth transistor T5 may include a portion of the emission control line 133 extending in the first direction. The first region B5 of the fifth transistor T5 may be electrically connected to the driving voltage line 175. The second region C5 may be electrically connected to the semiconductor layer A1 of the first transistor T1.

The semiconductor layer A6 of the sixth transistor T6 may include a portion of the silicon-based semiconductor layer SSL and include a channel region, a first region B6, and a second region C6, the channel region overlapping a sixth gate electrode G6 of the sixth transistor T6, and the first region B6 and the second region C6 being respectively at opposite sides of the channel region.

The sixth gate electrode G6 of the sixth transistor T6 may include a portion of the emission control line 133. The first region B6 of the sixth transistor T6 may be electrically connected to the semiconductor layer A1 of the first transistor T1, and the second region C2 may be electrically connected to a third connection electrode 167. The third connection electrode 167 may be electrically connected to a fourth connection electrode 177 arranged or disposed thereabove. The third connection electrode 167 and the fourth connection electrode 177 may be arranged or disposed between the sixth transistor T6 and the pixel electrode of the light-emitting diode to electrically connect the sixth transistor T6 to the pixel electrode.

The semiconductor layer A7 of the seventh transistor T7 may include a portion of the silicon-based semiconductor layer SSL and include a channel region, a first region B7, and a second region C7, the channel region overlapping a seventh gate electrode G7, and the first region B7 and the second region C7 being respectively at opposite sides of the channel region.

The channel region of the seventh transistor T7 may overlap the next scan line SLn. The seventh gate electrode G7 may include a portion of the next scan line SLn extending in the first direction.

Figure 7:
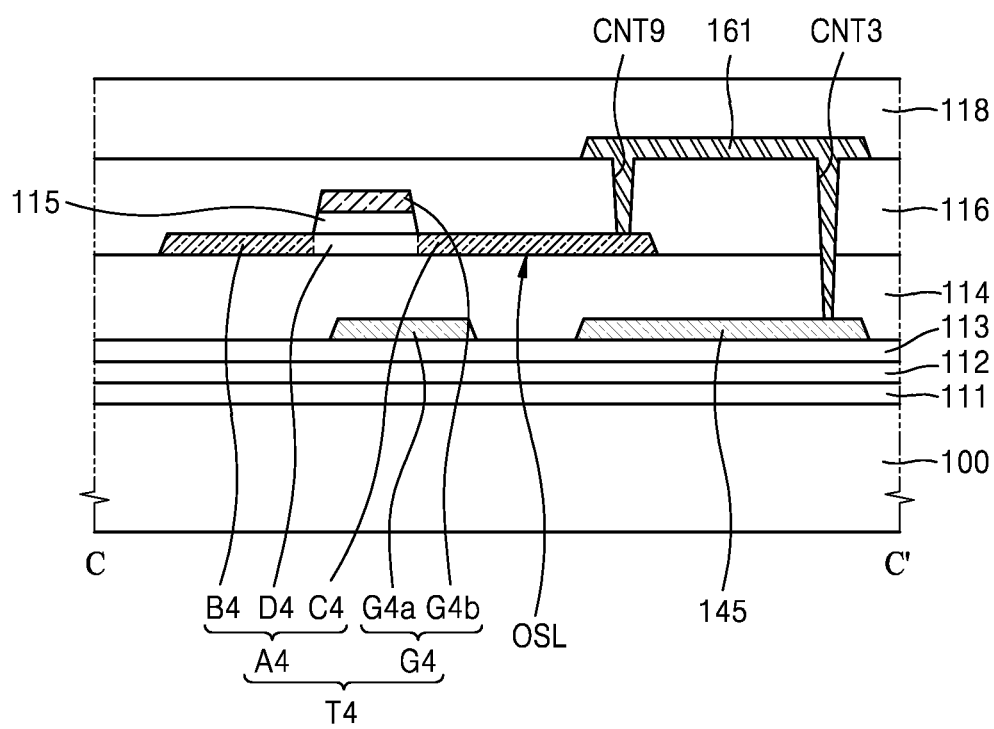
FIG. 7 is a schematic cross-sectional view of the pixel circuit taken along line C-C' of FIG. 5.

The first region B7 of the seventh transistor T7 may be electrically connected to the sixth transistor T6, and the second region C7 may be electrically connected to the second initialization voltage line 165. In an embodiment, it is shown in FIG. 7 that the second initialization voltage line 165 may extend in the first direction and may include a branch extending in the second direction, and the branch of the second initialization voltage line 165 may be electrically connected to the second region C7 of the seventh transistor T7 through the sixth contact hole CNT6. In an embodiment, the second initialization voltage line 165 may not include the branch.

The storage capacitor Cst may include the first electrode CE1 and the second electrode CE2. The first electrode CE1 and the second electrode CE2 may overlap the first transistor T1. As an example, the first electrode CE1 and the second electrode CE2 may overlap the semiconductor layer A1 or the channel region of the first transistor T1. In an embodiment, the first gate electrode G1 of the first transistor T1 may include the first electrode CE1.

The second electrode CE2 of the storage capacitor Cst may include a portion of a transverse wring HL extending in the first direction, and the driving voltage line 175 may be electrically connected to the second electrode CE2 and/or the transverse wiring HL through the seventh contact hole CNT7. The driving voltage line 175 may directly contact the second electrode CE2 and/or the transverse wiring HL through the seventh contact hole CNT7, or be electrically connected to the second electrode CE2 and/or the transverse wiring HL through a connection metal below the driving voltage line 175.

The boost capacitor Cbt may include the third electrode CE3 and the fourth electrode CE4. The third electrode CE3 may include a portion of the first scan line SL1. In other words, a portion of the first scan line SL1 may include the third electrode CE3. The third electrode CE3 may be integral with the second gate electrode G2. The fourth electrode CE4 of the boost capacitor Cbt overlaps the third electrode CE3 and may include an oxide-based semiconductor. As an example, a portion of the oxide-based semiconductor layer OSL may include the fourth electrode CE4 of the boost capacitor Cbt.

In an embodiment, the display apparatus may have a structure in which the pixel circuit PC shown in FIG. 3 is repeatedly arranged or disposed in a row direction and a column direction. Alternatively, the display apparatus may have a flip structure in which two pixel circuits neighboring each other in FIG. 3 are horizontally symmetric with respect to a virtual axis arranged or disposed therebetween in the second direction (for example a y-direction).

Figure 4:
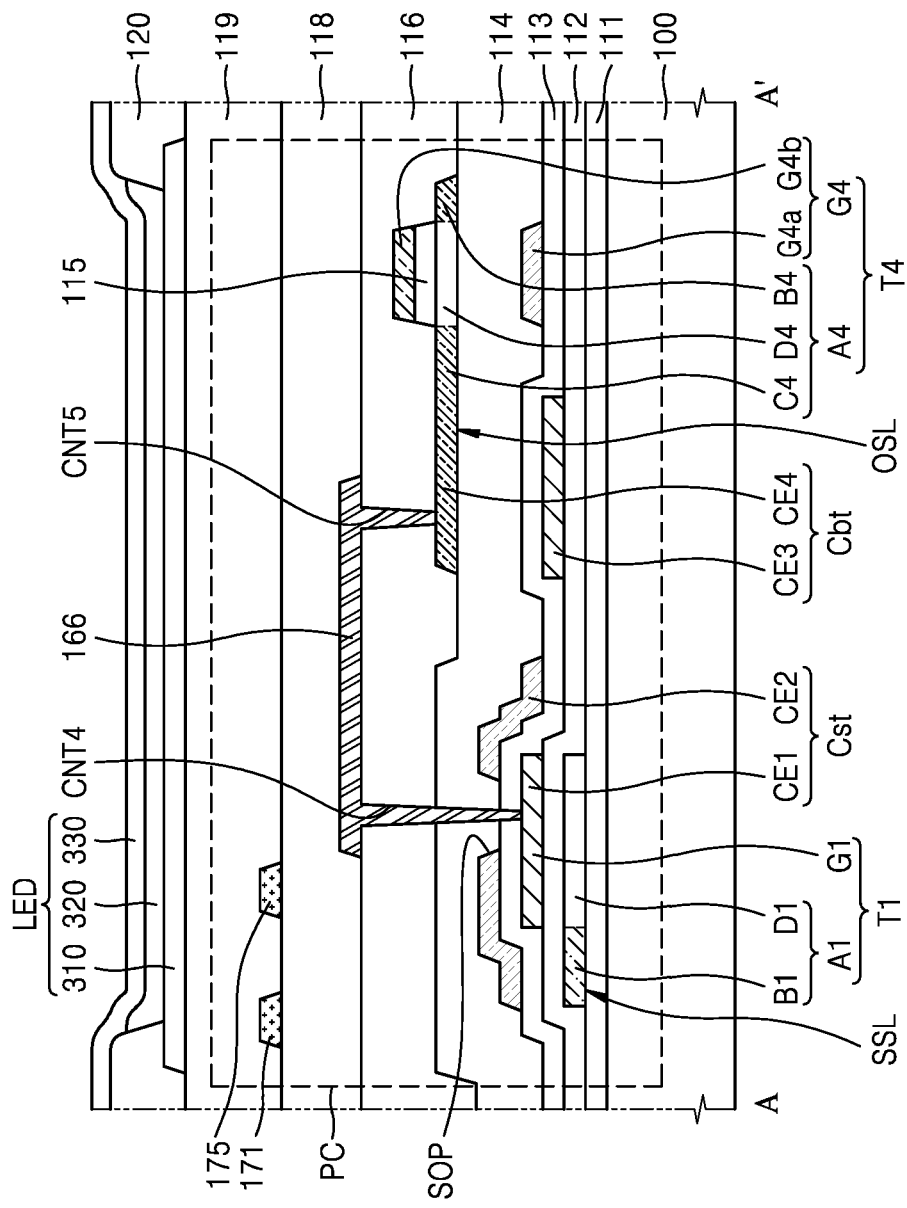
FIG. 4 is a schematic cross-sectional view of a pixel circuit and a light-emitting diode arranged thereon, taken along line A-A' of FIG. 3.

FIG. 4 is a schematic cross-sectional view of a display apparatus according to an embodiment and a schematic cross-sectional view of the pixel circuit PC and the light-emitting diode LED arranged or disposed thereon taken along line A-A' of FIG. 3.

Referring to FIG. 4, the pixel circuit PC may include the structure described with reference to FIG. 3 and be arranged or disposed over a substrate 100. The substrate 100 may include glass or a polymer resin. The polymer resin may include polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose tri acetate (TAC), and cellulose acetate propionate (CAP).

A buffer layer 111 may prevent impurities from penetrating into a semiconductor layer of the pixel circuit PC, for example, the silicon-based semiconductor layer SSL. The buffer layer 111 may include an inorganic insulating material such as silicon oxide, silicon oxynitride, and silicon nitride and include a single layer or a multi-layer including the above materials.

The silicon-based semiconductor layer SSL may be arranged or disposed on the buffer layer 111. With regard to this, FIG. 4 shows the semiconductor layer A1 of the first transistor T1, which may be a portion or region of the silicon-based semiconductor layer SSL. The semiconductor layer A1 of the first transistor T1 may include a channel region D1 and impurity regions, the channel region D1 overlapping the first gate electrode G1, and the impurity regions being respectively at opposite sides of the channel region D1.

A first insulating layer 112 may be arranged or disposed on the silicon-based semiconductor layer SSL. The first insulating layer 112 may correspond to a gate insulating layer that may insulate the semiconductor layer arranged or disposed on the silicon-based semiconductor layer SSL from the relevant gate electrode overlapping the relevant semiconductor layer. A portion of the first insulating layer 112 may correspond to the gate insulating layer that may electrically insulate the semiconductor layer A1 of the first transistor T1 from the first gate electrode G1. Similarly, the first insulating layer 112 may be arranged or disposed between the semiconductor layers A2, A5, A6, and A7 (see FIG. 3) arranged or disposed along the silicon-based semiconductor layer SSL and the gate electrodes (for example the second, fifth, sixth, and seventh gate electrodes G2, G5, G6, and G7 of FIG. 3) respectively corresponding to the relevant semiconductor layers. The first insulating layer 112 may include an inorganic insulating material such as silicon oxide, silicon oxynitride, and silicon nitride and include a single layer or a multi-layer including the above materials.

The first gate electrode G1, and the other gate electrodes, for example, the second gate electrode G2 (see FIG. 3), the fifth gate electrode G5 (see FIG. 3), the sixth gate electrode G6 (see FIG. 3), and the seventh gate electrode G7 (see FIG. 3) may include a low-resistance conductive material such as molybdenum (Mo), aluminum (Al), copper (Cu), and/or titanium (Ti) and include a single-layered or multi-layered structure including the above materials.

The first electrode CE1 of the storage capacitor Cst may be arranged or disposed on the first insulating layer 112, and the second electrode CE2 may be arranged or disposed on a second insulating layer 113 on the first insulating layer 112. In an embodiment, in the case where the storage capacitor Cst overlaps the first transistor T1, the first electrode CE1 of the storage capacitor Cst may include a portion of the first gate electrode G1, and the second electrode CE2 may include an opening SOP for electric connection between the node connection line 166 and the first gate electrode G1. The second insulating layer 113 may include an inorganic insulating material such as silicon oxide, silicon oxynitride, and silicon nitride and include a single layer or a multi-layer including the above materials.

The first electrode CE1 and/or the second electrode CE2 may include a low-resistance conductive material such as molybdenum (Mo), aluminum (Al), copper (Cu), and/or titanium (Ti) and include a single-layered or multi-layered structure including the above materials.

A third insulating layer 114 may be arranged or disposed on the storage capacitor Cst. The third insulating layer 114 may include an inorganic insulating material such as silicon oxide, silicon oxynitride, and silicon nitride and include a single layer or a multi-layer including the above materials.

The oxide-based semiconductor layer OSL may be arranged or disposed on the third insulating layer 114. With regard to this, FIG. 4 shows the semiconductor layer A4 of the fourth transistor T4, which may be a portion or region of the oxide-based semiconductor layer OSL. The semiconductor layer A4 of the fourth transistor T4 may include a channel region D4, a first region B4, and a second region C4, the first region B4 and the second region C4 being respectively at opposite sides of the channel region D4.

The fourth gate electrode G4 of the fourth transistor T4 may include a bottom gate electrode G4a and a top gate electrode G4b respectively disposed under or below and on the channel region D4. The bottom gate electrode G4a of FIG. 4 may include a portion of the third conductive layer 141 described with reference to FIG. 3, and the top gate electrode G4b may include a portion of the fourth conductive layer 151 described with reference to FIG. 3.

The bottom gate electrode G4a may be below the channel region D4 of the fourth transistor T4 and may overlap the channel region D4 of the fourth transistor T4 with the third insulating layer 114 therebetween. The top gate electrode G4b may be over the channel region D4 of the fourth transistor T4 with a fourth insulating layer 115 therebetween. The fourth insulating layer 115 may not be entirely formed or disposed over the substrate 100 but be locally patterned. The fourth insulating layer 115 may include an inorganic insulating material such as silicon oxide, silicon oxynitride, and silicon nitride and include a single layer or a multi-layer including the above materials.

Though not shown, the structures of the semiconductor layer A3 and the third gate electrode G3 of the third transistor T3 described with reference to FIG. 3 may be the same as the structures of the semiconductor layer A4 and the fourth gate electrode G4 of the fourth transistor T4 shown in FIG. 4.

A fifth insulating layer 116 may be arranged or disposed on a transistor including an oxide, for example, the fourth transistor T4 and the third transistor T3 (see FIG. 3). The fifth insulating layer 116 may include an inorganic insulating material such as silicon oxide, silicon oxynitride, and silicon nitride and include a single layer or a multi-layer including the above materials.

The third electrode CE3 of the boost capacitor Cbt may be on the first insulating layer 112, and the fourth electrode CE4 may be on the third insulating layer 114. The third electrode CE3 and/or the fourth electrode CE4 may include a low-resistance conductive material such as molybdenum (Mo), aluminum (Al), copper (Cu), and/or titanium (Ti) and include a single-layered or multi-layered structure including the above materials.

The node connection line 166 may be on the fifth insulating layer 116. The node connection line 166 may be electrically connected to the first gate electrode G1 and the oxide-based semiconductor layer OSL through the fourth contact hole CNT4 and the fifth contact hole CNT5. The node connection line 166 may include aluminum (Al), copper (Cu), and/or titanium (Ti) and include a single-layered or multi-layered structure including the above materials. As an example, the node connection line 166 may have a triple-layered structure of a Ti layer/an Al layer/a Ti layer.

A sixth insulating layer 118 may be on the node connection line 166. The sixth insulating layer 118 may include an inorganic insulating material and/or an organic insulating material. The organic insulating material may include benzocyclobutene (BCB), polyimide, or hexamethyldisiloxane (HMDSO).

The data line 171 and the driving voltage line 175 may be arranged or disposed on the sixth insulating layer 118. The data line 171 and/or the driving voltage line 175 may include aluminum (Al), copper (Cu), and/or titanium (Ti) and include a single-layered or multi-layered structure including the above materials. As an example, the data line 171 and/or the driving voltage line 175 may have a triple-layered structure of a Ti layer/an Al layer/a Ti layer.

Though it is shown in FIG. 4 that the data line 171 and the driving voltage line 175 are arranged or disposed on the sixth insulating layer 118, the data line 171 and/or the driving voltage line 175 may be arranged or disposed on the fifth insulating layer 116 or may include an auxiliary line arranged or disposed on the fifth insulating layer 116 and electrically connected to the data line 171 and/or the driving voltage line 175 in an embodiment.

A seventh insulating layer 119 may be arranged or disposed on the pixel circuit PC. The seventh insulating layer 119 may include an organic insulating layer such as benzocyclobutene (BCB), polyimide, or hexamethyldisiloxane (HMDSO).

The light-emitting diode LED may include a pixel electrode 310, an emission layer 320, and an opposite electrode 330.

Edges of the pixel electrode 310 may be covered or overlapped by an upper insulating layer 120. The emission layer 320 may overlap the pixel electrode 310 through an opening formed in the upper insulating layer 120.

The pixel electrode 310 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The pixel electrode 310 may include the reflective layer and a transparent conductive layer, the transparent conductive layer being disposed on and/or under or below the reflective layer. The transparent conductive layer may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 310 may have a triple-layered structure of an ITO layer/an Ag layer/an ITO layer.

In an embodiment, the emission layer 320 may include an organic material. The emission layer 320 may include a material that emits light having a predetermined color (for example red, green, or blue) and include a fluorescent or phosphorous material.

The opposite electrode 330 may include a metal having a relatively small work function. For example, the opposite electrode 330 may include a thin layer including silver (Ag), magnesium (Mg), aluminum (Al), nickel (Ni), chrome (Cr), lithium (Li), calcium (Ca), or an alloy thereof. In an embodiment, the opposite electrode 330 may include a transmissive electrode including silver (Ag) and magnesium (Mg).

Though it is described in FIG. 4 that the light-emitting diode LED may include an organic light-emitting diode including an organic material, the light-emitting diode LED may include an inorganic light-emitting diode including an inorganic material in an embodiment. The inorganic light-emitting diode may include a PN-junction diode including inorganic material semiconductor-based materials. In a case that a voltage may be applied to a PN-junction diode in a forward direction, holes and electrons are injected therein, and light having a preset color may be emitted by converting energy generated from recombination of the holes and the electrons into light energy. The inorganic light-emitting diode may have a width of about several micrometers to about hundreds of micrometers. In an embodiment, the inorganic light-emitting diode may be denoted by a micro light-emitting diode.

Figure 5:
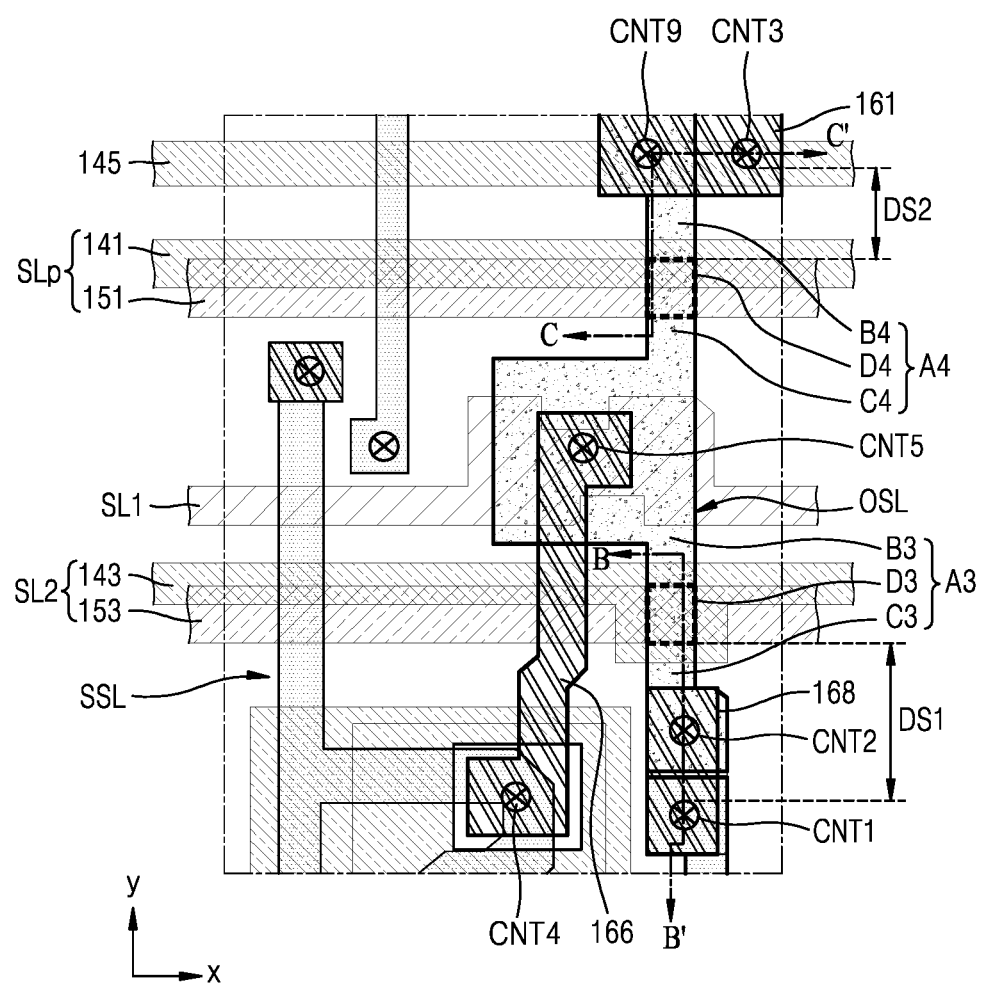
FIG. 5 is a plan view of a portion or a region of a pixel circuit of a display apparatus according to an embodiment.
Figure 6:
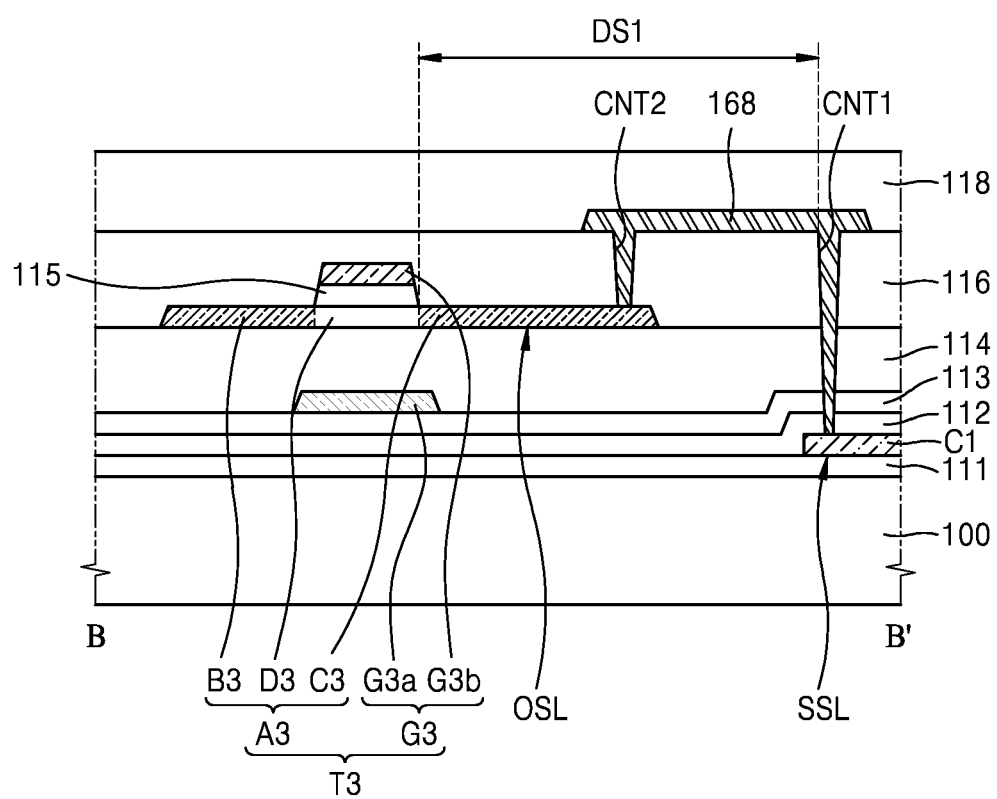
FIG. 6 is a schematic cross-sectional view of the pixel circuit taken along line B-B' of FIG. 5.

FIG. 5 is a plan view of a portion or region of a pixel circuit of a display apparatus according to an embodiment, FIG. 6 is a schematic cross-sectional view of the pixel circuit taken along line B-B' of FIG. 5, and FIG. 7 is a schematic cross-sectional view of the pixel circuit taken along line C-C' of FIG. 5.

FIG. 5 shows a portion or region of the pixel circuit PC shown in FIG. 4, for example, the oxide-based semiconductor layer OSL and a structure of the surroundings thereof, and shows that the third transistor T3 and the fourth transistor T4 may be formed or disposed along the oxide-based semiconductor layer OSL.

Referring to FIGS. 5 and 6, the semiconductor layer A3 of the third transistor T3 may include a channel region D3, the first region B3, and the second region C3, the first region B3 and the second region C3 being respectively at opposite sides of the channel region D3. The third gate electrode G3 of the third transistor T3 may include a bottom gate electrode G3a and a top gate electrode G3b, the bottom gate electrode G3a being below the channel region D3 of the third transistor T3, and the top gate electrode G3b being over the channel region D3 of the third transistor T3.

The channel region D3 of the third transistor T3 may include a region that overlaps the top gate electrode G3b and/or the bottom gate electrode G3a. In an embodiment, in the case where the third transistor T3 may include one gate electrode, the channel region D3 may be defined as a region that overlaps the one gate electrode. In an embodiment, in the case where the third transistor T3 may include the top gate electrode G3b and the bottom gate electrode G3a, the channel region D3 may be defined as a region that overlaps the top gate electrode G3b.

The first connection electrode 168 may be arranged or disposed over the third transistor T3. For example, the first connection electrode 168 may be arranged or disposed over the top gate electrode G3b of the third transistor T3 with the fifth insulating layer 116 therebetween.

The first connection electrode 168 may electrically connect the oxide-based semiconductor layer OSL to the silicon-based semiconductor layer SSL, the silicon-based semiconductor layer SSL being below the oxide-based semiconductor layer OSL. As an example, the first connection electrode 168 may electrically connect the semiconductor layer A3 of the third transistor T3 to the semiconductor layer of the first transistor. A portion of the first connection electrode 168 may be electrically connected to a conductive region of the third transistor T3, for example, the second region C3 through the second contact hole CNT2 defined in the fifth insulating layer 116 on the third transistor T3. Another portion of the first connection electrode 168 may be electrically connected to the second region C1 of the first transistor through the first contact hole CNT1 passing or extending through the first insulating layer 112, the second insulating layer 114, the third insulating layer 115, and the fifth insulating layer 116.

As shown in FIG. 5, the channel region D3 of the third transistor T3 may maintain a first distance DS1 from the first contact hole CNT1 in one or a direction, for example, in the second direction. The first distance DS1 may be 2 µm or greater. As an example, the first distance DS1 may be 2.0 µm≤DS1≤10 µm, 2.0 µm≤DS1≤8 µm, or 2.0 µm≤DS1≤7 µm. In a case that the first distance DS1 deviates from the above-described lower limit, the characteristic of the semiconductor layer A3 of the third transistor T3 may be deteriorated and staining may occur.

A hydrogen concentration of the conductive regions of the third transistor T3, for example, the first region B3 and the second region C3 may be $1.1 \times 10^{21}$ atom/cm$^3$ or greater. An increase in the hydrogen concentration means that carriers inside the first region B3 and the second region C3 increase and the characteristics of the third transistor T3 improves. In a case that the hydrogen concentration of the first region B3 and the second region C3 deviates from the lower limit, it may be difficult to expect a normal operation of the third transistor T3.

Referring to FIGS. 5 and 7, the semiconductor layer A4 of the fourth transistor T4 may include a channel region D4, the first region B4, and the second region C4, the first region B4 and the second region C4 being respectively at opposite sides of the channel region D4. The fourth gate electrode G4 of the fourth transistor T4 may include a bottom gate electrode G4a and a top gate electrode G4b, the bottom gate electrode G4a being below the channel region D4 of the fourth transistor T4, and the top gate electrode G4b being over the channel region D4 of the fourth transistor T4.

The channel region D4 of the fourth transistor T4 may include a region that overlaps the top gate electrode G4b and/or the bottom gate electrode G4a. In an embodiment, in the case where the fourth transistor T4 may include one gate electrode, the channel region D4 may be defined as a region that overlaps the one gate electrode. In an embodiment, in the case where the fourth transistor T4 may include the top gate electrode G4b and the bottom gate electrode G4a, the channel region D4 may be defined as a region that overlaps the top gate electrode G4b.

The second connection electrode 161 may be arranged or disposed over the fourth transistor T4. The second connection electrode 161 may be disposed over the fifth insulating layer 116, and the top gate electrode G4b of the fourth transistor T4 may be disposed under or below the fifth insulating layer 116. For example, the second connection electrode 161 may be arranged or disposed over the top gate electrode G4b of the fourth transistor T4 with the fifth insulating layer 116 disposed therebetween.

The second connection electrode 161 may electrically connect the oxide-based semiconductor layer OSL to a line, the line being below the oxide-based semiconductor layer OSL. As an example, the second connection electrode 161 may electrically connect the semiconductor layer A4 of the fourth transistor T4 to the first initialization voltage line 145. A portion of the second connection electrode 161 may be electrically connected to a conductive region of the fourth transistor T4, for example, the second region C4 through a ninth contact hole CNT9 formed in the fifth insulating layer 116. Another portion of the second connection electrode 161 may be electrically connected to the second region C1 of the first transistor T1 through the third contact hole CNT3 passing or extending through the third insulating layer 114 and the fifth insulating layer 116.

As shown in FIG. 5, the channel region D4 of the fourth transistor T4 may maintain a second distance DS2 from the third contact hole CNT3 in one or a direction, for example, in the second direction. The second distance DS2 may be 2 µm or greater. As an example, the second distance DS2 may be 2.0 µm≤DS2≤10 µm, 2.0 µm≤DS2≤8 µm, or 2.0 µm≤DS2≤7 µm. In a case that the second distance DS2 deviates from the above-described lower limit, the characteristic of the semiconductor layer A4 of the fourth transistor T4 may be deteriorated.

A hydrogen concentration of the conductive regions of the fourth transistor T4, for example, the first region B4 and the second region C4 may be about $1.1 \times 10^{21}$ atom/cm$^3$ or greater. In a case that the above range is met, the fourth transistor T4 may normally operate.

Figure 8:
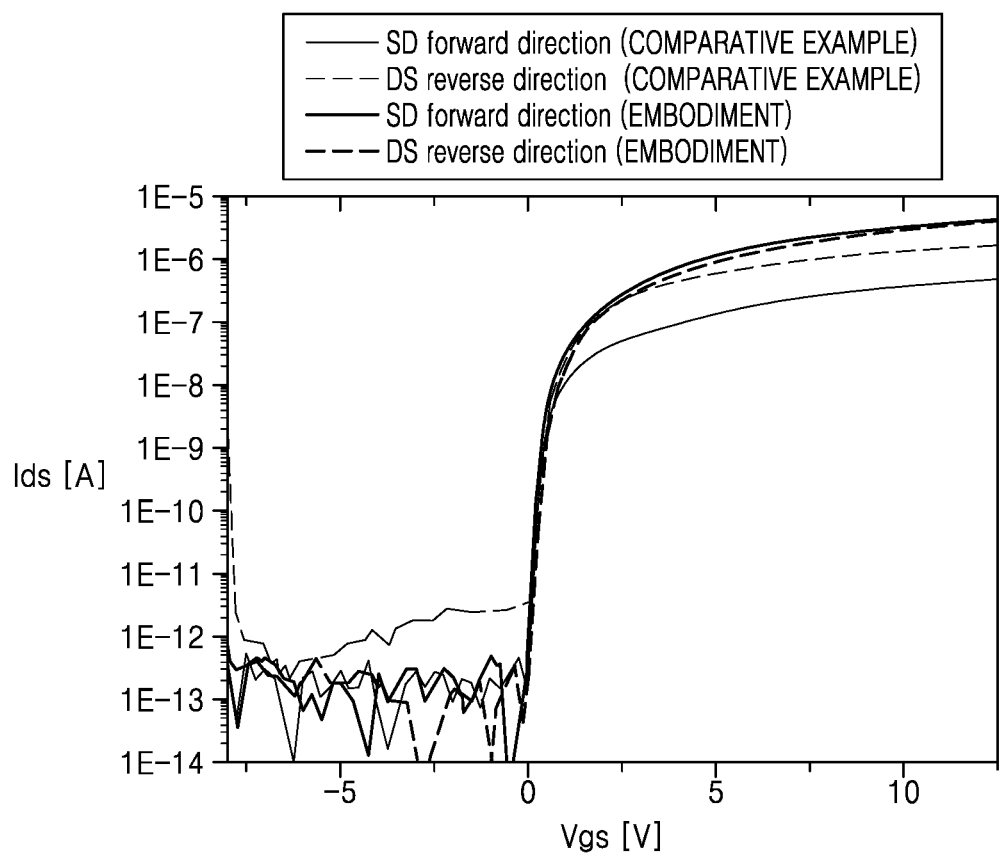
FIG. 8 is a graph showing transfer curves of third transistors according to an embodiment and a comparative example.

FIG. 8 is a graph showing a transfer curve of third transistors according to an embodiment and a comparative example. In FIG. 8, Ids represents a drain-source current and Vgs represents a gate-source voltage.

A pixel circuit according to a comparative example of FIG. 8 corresponds to the case where the first distance DS1 described with reference to FIG. 5 is formed less than about 2 µm (for example about 1.6 µm), which shows that a current deviation between a current in a SD forward direction and a current in a DS reverse direction is large. In contrast, according to an embodiment, in the case where the first distance DS1 may be formed about 2 µm or greater, as shown in FIG. 8, a current deviation between a current in a SD forward direction and a current in a DS reverse direction may be very small.

As described above, the conductive regions of the oxide-based semiconductor layer OSL may be formed through a plasma treatment that may use a hydrogen (H)-based gas, a fluorine (F)-based gas, and/or a combination thereof. During processes performed after the plasma treatment, for example, a process of forming a contact hole and an annealing process, elements contained in the conductive regions may be reduced and thus the characteristic of the transistor may be deteriorated. As an example, due to a dehydrogenation phenomenon caused by heat applied during the annealing process, the characteristic of the third transistor T3 formed or disposed along the oxide-based semiconductor layer OSL may be deteriorated and staining may occur to an image displayed through the display apparatus, which deteriorates display quality. In contrast, according to an embodiment, with the above-mentioned structure, the characteristic of the third transistor T3 may be improved and the occurrence of staining may be minimized.

A hydrogen concentration of the conductive regions of the third transistor T3, for example, the first region B3 and the second region C3 may be $1.1 \times 10^{21}$ atom/cm$^3$ or greater. In a case that the above range is met, characteristic of the third transistor T3 may be improved. An increase of the hydrogen concentration means that carriers inside the first region B3 and the second region C3 increase and the characteristic of the third transistor T3 improves.

Figure 9:
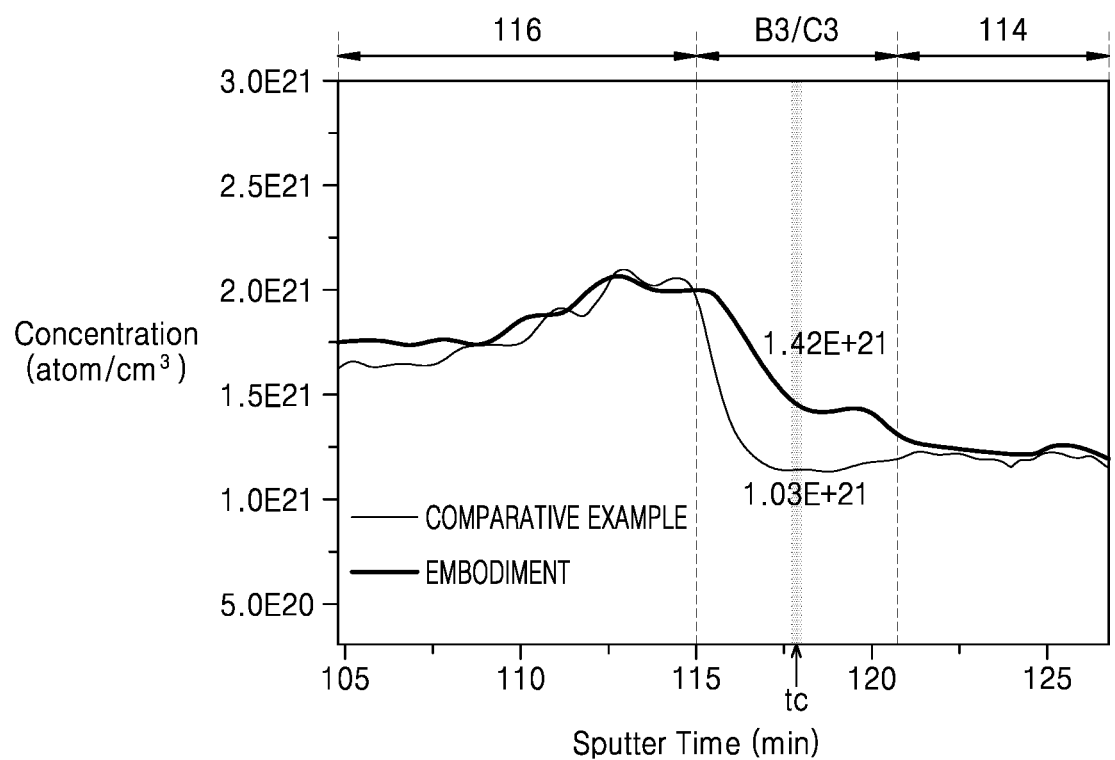
FIG. 9 is a graph showing hydrogen concentration measured through secondary ion mass spectroscopy (SIMS) for the third transistor according to an embodiment and a comparative example.

FIG. 9 is a graph showing hydrogen concentration measured through secondary ion mass spectroscopy (SIMS) for the third transistor according to an embodiment and a comparative example; As shown in FIGS. 4 and 6, since the conductive regions of the oxide-based semiconductor layer OSL may be arranged or disposed between the third insulating layer 114 and the fifth insulating layer 116, in a case that SIMS may be performed on a display apparatus having the relevant structure, the hydrogen concentrations of the fifth insulating layer 115 and the third insulating layer 114 may also be measured as shown in FIG. 9, the fifth insulating layer 115 and the third insulating layer 114 being disposed above and below the conductive regions B3 and/or C3 of the third transistor T3.

The comparative example shows the hydrogen concentration of the conductive region of the third transistor of a pixel circuit which is less than about 2 µm as described above and the hydrogen concentration of the conductive region in a thickness direction, for example, a central portion tc of the first region B3 may be about $1.03 \times 10^{21}$ atom/cm$^3$ or greater. In contrast, according to an embodiment, the hydrogen concentration of the conductive region in a thickness direction, for example, a central portion tc of the first region B3 may be about $1.4 \times 10^{21}$ atom/cm$^3$ or greater, for example, about $1.42 \times 10^{21}$ atom/cm$^3$.

Figure 10:
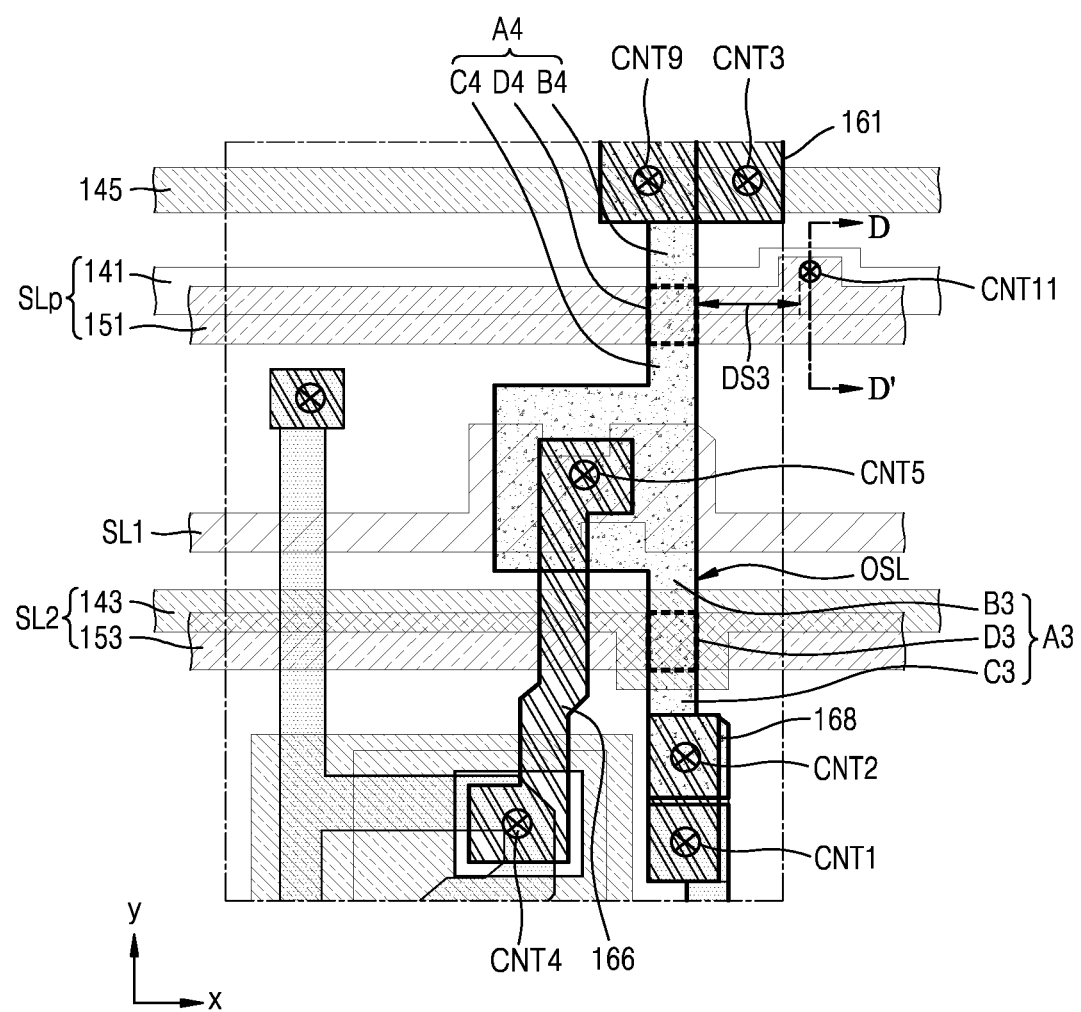
FIG. 10 is a plan view of a portion of a display apparatus according to an embodiment.
Figure 11:
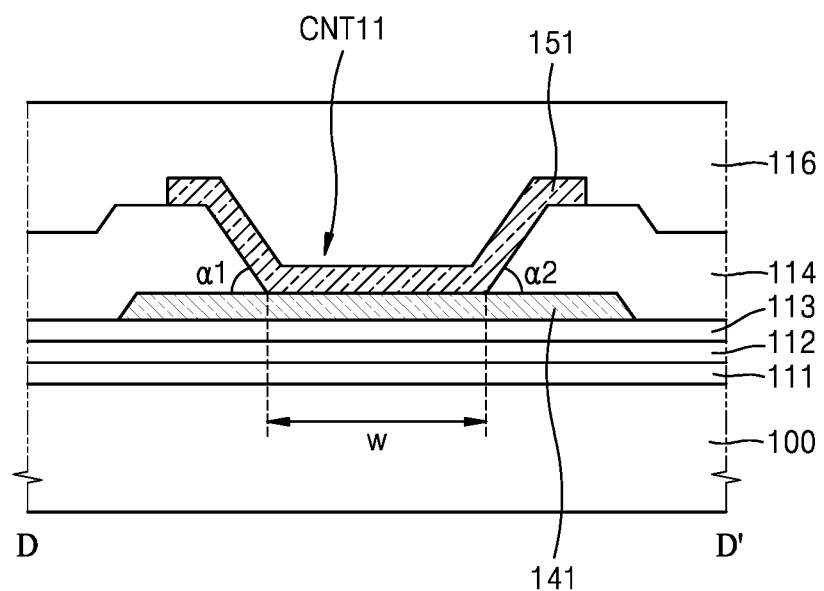
FIG. 11 is a schematic cross-sectional view of the display apparatus taken along line D-D' of FIG. 10.

FIG. 10 is a plan view of a portion of a display apparatus according to an embodiment, and FIG. 11 is a schematic cross-sectional view of the display apparatus taken along line D-D' of FIG. 10. Since the display apparatus shown in FIG. 10 may include all the characteristics described with reference to FIGS. 5 to 9, descriptions of the same structures as those shown in FIG. 5 among the structures shown in FIG. 10 are omitted.

Referring to FIG. 10, the previous scan line SLp may extend in the first direction to cross or intersect the oxide-based semiconductor layer OSL and may include layers arranged or disposed on different layers. As an example, as shown in FIG. 10, the previous scan line SLp may include the third conductive layer 141 and the fourth conductive layer 151. The third conductive layer 141 may be arranged or disposed below the oxide-based semiconductor layer OSL, and the fourth conductive layer 151 may be arranged or disposed over the oxide-based semiconductor layer OSL. The third conductive layer 141 and the fourth conductive layer 151 on different layers may be electrically connected to each other through an eleventh contact hole CNT11.

The eleventh contact hole CNT11 may be apart from the channel region D4 of the fourth transistor T4. A third distance DS3 between the channel region D4 of the fourth transistor T4 and the eleventh contact hole CNT11 in the first direction may be 2.4 µm or greater. In a case that the third distance DS3 is less than the above-described lower limit, the characteristic of the fourth transistor T4 may be deteriorated and thus a display quality may be deteriorated.

Referring to FIG. 11, the third conductive layer 141 may be arranged or disposed on the second insulating layer 113, and the fourth conductive layer 151 may be arranged or disposed over the third conductive layer 141 with the third insulating layer 114 therebetween. The third insulating layer 114 may include the eleventh contact hole CNT11 that may overlap a portion of the third conductive layer 141, and the fourth conductive layer 151 may be electrically connected to the third conductive layer 141 through the eleventh contact hole CNT11.

The lateral surfaces of the third insulating layer 114 that define the eleventh contact hole CNT11 may include an inclined surface. A slope of the inclined surface, that is, angles α1 and α2 formed between the inclined surface and the top surface of the third conductive layer 141 (or the top surface of the substrate 110) may be about 86° or less. The thickness of a portion of the fourth conductive layer 151 that may be arranged or disposed on the inclined surface may be prevented from being reduced by forming the angles α1 and α2 about 86° or less.

The size of the eleventh contact hole CNT11, for example, a width w of the eleventh contact hole CNT11 may be formed about 2.2 µm or less. In a case that the width w of the eleventh contact hole CNT11 is satisfied with the above condition, the characteristic of the fourth transistor T4 may be improved.

Figure 12:
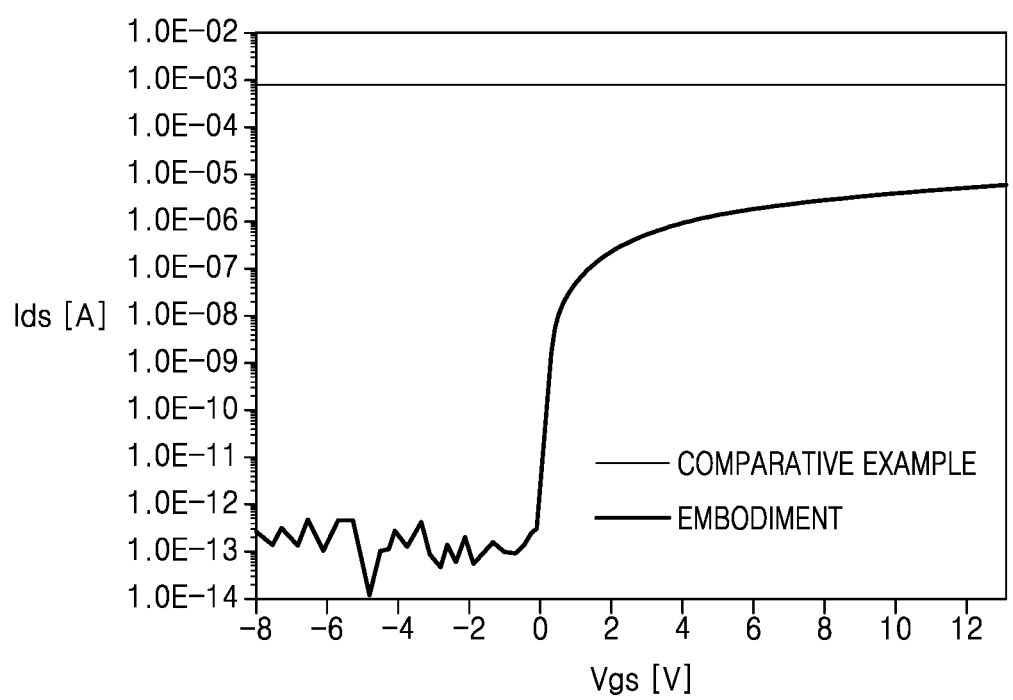
FIG. 12 is a graph showing a transfer curve of a fourth transistor according to an embodiment.

FIG. 12 is a graph showing a transfer curve of the fourth transistor according to an embodiment.

The comparative example of FIG. 12 shows the case where the third distance DS3 described with reference to FIG. 10 may be about 2.2 µm and the width w of the eleventh contact hole CNT11 may be about 2.6 µm. Referring to the comparative example of FIG. 12, it is difficult to expect a transfer curve of the fourth transistor T4. In contrast, according to an embodiment, for example, in the case where the third distance DS may be about 2.4 µm and the width w of the eleventh contact hole CNT11 may be about 2.2 µm, it is shown that an operation of the fourth transistor T4 is excellent.

Figure 13:
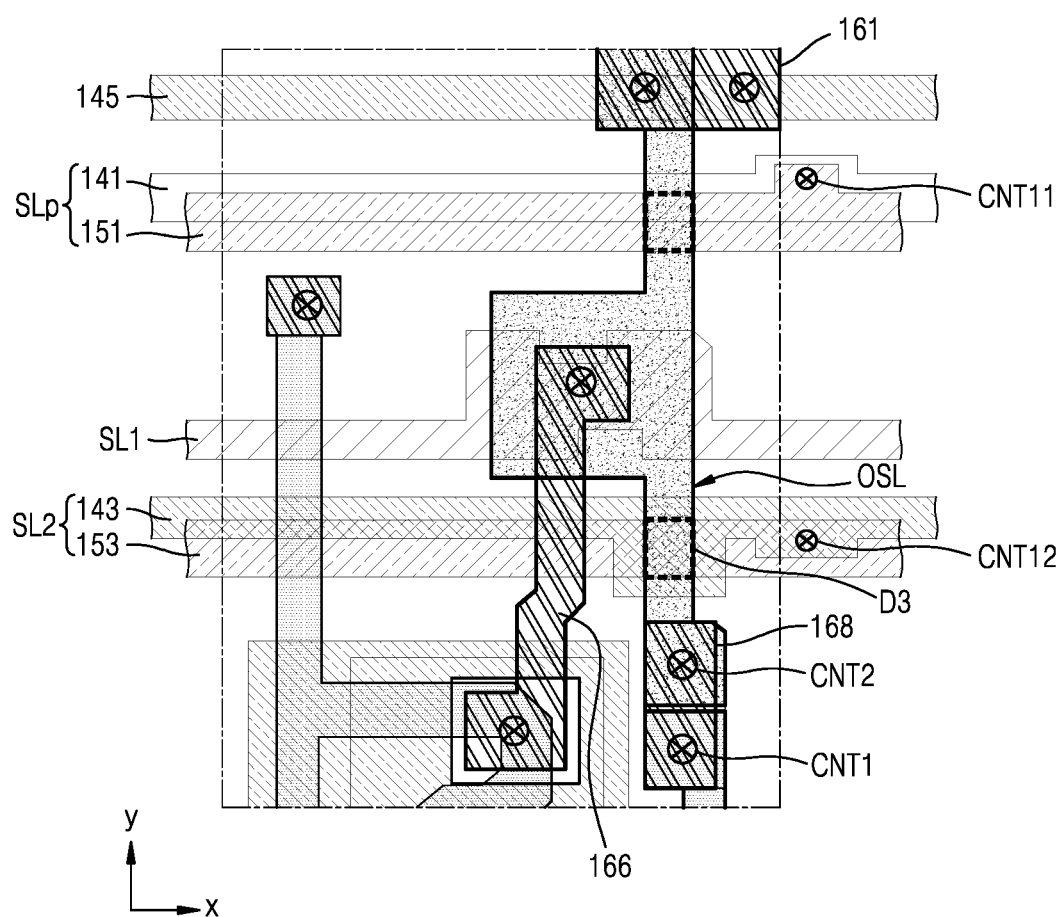
FIG. 13 is a plan view of a portion or region of a display apparatus according to an embodiment.

The structure described with reference to FIGS. 10 and 11 is applicable to between the second scan line SL2 and the third transistor T3. FIG. 13 is a plan view of a portion of a display apparatus according to an embodiment. As shown in FIG. 13, the first conductive layer 143 and the second conductive layer 153 of the second scan line SL2 may be electrically connected to each other through a twelfth contact hole CNT12.

Referring to FIG. 13, the twelfth contact hole CNT12 may have the same structure and width as those of the eleventh contact hole CNT11 described with reference to FIGS. 10 and 11. A distance between the twelfth contact hole CNT12 and the channel region D3 of the third transistor T3 may be 2.4 μm or greater as described above. For example, inclination angles of the lateral surfaces of an insulating layer arranged or disposed between the first conductive layer 143 and the second conductive layer 153 and defining the twelfth contact hole CNT12 may also have the conditions of the inclination angles α1 and α2 of the lateral surfaces of the third insulating layer 114 described above with reference to FIG. 11.

According to embodiments, transmittance of a transmission area may be sufficiently secured through a simple process.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a first silicon transistor including:
      a first semiconductor layer including a silicon-based semiconductor; and
      a first gate electrode overlapping the first semiconductor layer;
   a first oxide transistor including:
      a second semiconductor layer spaced apart from the first semiconductor layer and including an oxide-based semiconductor; and
      a second gate electrode;
   an upper insulating layer disposed on the first semiconductor layer and the second semiconductor layer, the upper insulating layer including a first contact hole and a second contact hole; and
   a first connection electrode disposed on the upper insulating layer, electrically connected to the first semiconductor layer through the first contact hole, and electrically connected to the second semiconductor layer through the second contact hole, wherein
   the second semiconductor layer includes a channel region, a source region, and a drain region, the source region and the drain region being arranged at opposite sides of the channel region, and
   a first distance between the channel region of the second semiconductor layer and the first contact hole is about 2 μm or greater.

2. The display apparatus of claim 1, wherein a hydrogen concentration of the source region or the drain region of the second semiconductor layer is about $1.1 \times 10^{21}$ atom/cm$^3$ or greater.

3. The display apparatus of claim 1, further comprising:
   an insulating layer disposed between the first semiconductor layer and the second semiconductor layer.

4. The display apparatus of claim 1, wherein
   the first semiconductor layer includes a channel region, a source region, and a drain region, the source region and the drain region being arranged at opposite sides of the channel region, and
   the channel region of the first semiconductor layer includes a bent shape.

5. The display apparatus of claim 1, further comprising:
   a node connection line electrically connecting the first gate electrode of the first silicon transistor to the first oxide transistor.

6. The display apparatus of claim 1, further comprising:
   a second oxide transistor including a third semiconductor layer and a third gate electrode, the third semiconductor layer including an oxide-based semiconductor.

7. The display apparatus of claim 6, wherein the third semiconductor layer of the second oxide transistor and the second semiconductor layer of the first oxide transistor are integral with each other.

8. The display apparatus of claim 6, further comprising:
   an initialization voltage line;
   a first signal line extending in a same direction as the initialization voltage line; and
   a second connection electrode disposed on the third semiconductor layer of the second oxide transistor and the initialization voltage line, the second connection electrode electrically connecting the initialization voltage line to the third semiconductor layer.

9. The display apparatus of claim 8, wherein
   the upper insulating layer further includes a third contact hole,
   the second connection electrode is electrically connected to the initialization voltage line through the third contact hole, and
   a second distance between a channel region of the third semiconductor layer and the third contact hole is about 2 μm or greater.

10. The display apparatus of claim 8, wherein the first signal line includes:
    a first conductive layer overlapping the third semiconductor layer;
    a second conductive layer disposed below the second semiconductor layer; and
    an insulating layer disposed between the first conductive layer and the second conductive layer and including a contact hole,
    wherein the first conductive layer is electrically connected to the second conductive layer through the contact hole of the insulating layer.

11. The display apparatus of claim 10, wherein a width of the contact hole of the insulating layer is about 2.2 μm or less.

12. The display apparatus of claim 10, wherein a third distance between a channel region of the third semiconductor layer and the contact hole of the insulating layer is about 2.4 μm or greater.

13. The display apparatus of claim 10, wherein
    the insulating layer includes lateral surfaces that form the contact hole, and
    an inclination angle of the lateral surfaces is about 86° or less.

14. The display apparatus of claim 1, further comprising:
    a first capacitor electrically connected to the first silicon transistor; and a second capacitor electrically connected to the first oxide transistor.

15. The display apparatus of claim 14, wherein an electrode of the second capacitor and the second semiconductor layer include a same material.

16. A display apparatus comprising:
a silicon-based semiconductor layer including a first semiconductor layer of a first silicon transistor;
an oxide-based semiconductor layer spaced apart from the silicon-based semiconductor layer, the oxide-based semiconductor layer including a second semiconductor layer of a first oxide transistor;
an upper insulating layer disposed on the silicon-based semiconductor layer and the oxide-based semiconductor layer, the upper insulating layer including a first contact hole and a second contact hole; and
a first connection electrode disposed on the upper insulating layer, electrically connected to the first semiconductor layer through the first contact hole, and electrically connected to the second semiconductor layer through the second contact hole, wherein
the oxide-based semiconductor layer includes a channel region of the first oxide transistor, and
a first distance between the channel region and the first contact hole is about 2 μm or greater.

17. The apparatus of claim 16, wherein
the oxide-based semiconductor layer further includes a third semiconductor layer of a second oxide transistor, and
the second semiconductor layer and the third semiconductor layer are integral with each other.

18. The apparatus of claim 17, wherein each of the second semiconductor layer and the third semiconductor layer includes:
a channel region; and
a source region and a drain region respectively arranged at opposite sides of the channel region,
wherein a hydrogen concentration of the source region or the drain region is about $1.1 \times 10^{21}$ atom/cm$^3$ or greater.

19. The apparatus of claim 17, further comprising:
an initialization voltage line that provides an initialization voltage to the second oxide transistor; and
a second connection electrode disposed on the third semiconductor layer of the second oxide transistor and the initialization voltage line and electrically connecting the initialization voltage line to the third semiconductor layer.

20. The apparatus of claim 19, wherein
the upper insulating layer further includes a third contact hole,
the second connection electrode is electrically connected to the initialization voltage line through the third contact hole, and
a second distance between the channel region of the third semiconductor layer and the third contact hole is about 2 μm or greater.

21. The apparatus of claim 19, further comprising:
a first signal line overlapping the second semiconductor layer of the first oxide transistor; and
a second signal line overlapping the third semiconductor layer of the second oxide transistor,
wherein the first signal line or the second signal line includes:
a first conductive layer overlapping the oxide-based semiconductor layer;
a second conductive layer disposed below the oxide-based semiconductor layer; and
an insulating layer disposed between the first conductive layer and the second conductive layer and including a contact hole, and
wherein the first conductive layer is electrically connected to the second conductive layer through the contact hole of the insulating layer.

22. The apparatus of claim 21, wherein a width of the contact hole of the insulating layer is about 2.2 μm or less.

23. The apparatus of claim 21, wherein a third distance between the channel region of the third semiconductor layer and the contact hole of the insulating layer is about 2.4 μm or greater.

24. The apparatus of claim 21, wherein
the insulating layer includes lateral surfaces that form the contact hole, and
an inclination angle of the lateral surfaces is about 86° or less.

25. The apparatus of claim 16, further comprising:
an insulating layer disposed between the silicon-based semiconductor layer and the oxide-based semiconductor layer.

* * * * *